(12) United States Patent
Wei et al.

(10) Patent No.: US 12,445,123 B2
(45) Date of Patent: Oct. 14, 2025

(54) RESET SWITCH POWER SUPPLY ON-OFF CONTROL CIRCUIT AND SYSTEM

(71) Applicant: Sublue Underwater AI Co., LTD., Tianjin (CN)

(72) Inventors: Jiancang Wei, Tianjin (CN); Lizhao Yu, Tianjin (CN); Wei Li, Tianjin (CN); Yan Dong, Tianjin (CN); Xiuwen Shan, Tianjin (CN); Yubin Ma, Tianjin (CN); Jiyang He, Tianjin (CN)

(73) Assignee: Sublue Underwater AI Co., LTD., Tianjin (CN)

( * ) Notice: Subject to any disclaimer, the term of this patent is extended or adjusted under 35 U.S.C. 154(b) by 0 days.

(21) Appl. No.: 18/703,884

(22) PCT Filed: Jun. 15, 2023

(86) PCT No.: PCT/CN2023/100324
§ 371 (c)(1),
(2) Date: Apr. 23, 2024

(87) PCT Pub. No.: WO2024/007835
PCT Pub. Date: Jan. 11, 2024

(65) Prior Publication Data
US 2024/0421814 A1    Dec. 19, 2024

(30) Foreign Application Priority Data

Jul. 8, 2022   (CN) .......................... 202210797125.6

(51) Int. Cl.
*H03K 17/18*   (2006.01)
*H03K 17/14*   (2006.01)
*H03K 17/22*   (2006.01)

(52) U.S. Cl.
CPC .......... *H03K 17/18* (2013.01); *H03K 17/145* (2013.01); *H03K 17/223* (2013.01)

(58) Field of Classification Search
CPC ...... H03K 17/14; H03K 17/145; H03K 17/18; H03K 17/22; H03K 17/223
(Continued)

(56) References Cited

U.S. PATENT DOCUMENTS

| 2005/0057287 A1 | 3/2005 | Gossmann |
| 2012/0086481 A1* | 4/2012 | Chao .......................... G06F 1/26 327/143 |
| 2012/0092045 A1* | 4/2012 | Chao ........................ H03K 5/13 327/142 |

FOREIGN PATENT DOCUMENTS

| CN | 101399536 A | 4/2009 |
| CN | 103676746 A | 3/2014 |

(Continued)

OTHER PUBLICATIONS

International Search Report issued on Sep. 25, 2023, in corresponding International Application No. PCT/CN2023/100324; 6 pages.
(Continued)

*Primary Examiner* — William Hernandez
(74) *Attorney, Agent, or Firm* — Maier & Maier, PLLC

(57) ABSTRACT

A reset switch power supply on-off control circuit and system, used for reset switches. The reset switch power supply on-off control circuit includes a reset switch control circuit connected with a reset switch and is configured to collect a status of the reset switch and output a status signal and a first control signal; an MOS switch circuit connected with the reset switch control circuit and configured to receive the first control signal from the reset switch control circuit; and a main control chip connected with the reset switch control circuit and is configured to acquire the status signal from the reset switch control circuit and output a second control signal to the reset switch control circuit.

14 Claims, 2 Drawing Sheets

(58) Field of Classification Search
USPC .................................. 327/142, 143, 378
See application file for complete search history.

(56) References Cited

FOREIGN PATENT DOCUMENTS

| | | |
|---|---|---|
| CN | 105576950 A | 5/2016 |
| CN | 208589014 U | 3/2019 |
| CN | 209435361 U | 9/2019 |
| CN | 210721354 U | 6/2020 |
| CN | 210835664 U | 6/2020 |
| CN | 111371417 A | 7/2020 |
| CN | 216595996 U | 5/2022 |
| CN | 114866078 A | 8/2022 |

OTHER PUBLICATIONS

Office Action issued on Aug. 12, 2022, in corresponding Chinese Application No. 202210797125.6; 10 pages.
Office Action issued on Aug. 24, 2022, in corresponding Chinese Application No. 202210797125.6; 7 pages.

* cited by examiner

RESET SWITCH POWER SUPPLY ON-OFF CONTROL CIRCUIT AND SYSTEM

TECHNICAL FIELD

The application relates to the technical field of reset switches, in particular to a reset switch power supply on-off control circuit and system.

BACKGROUND

A reset switch power supply, characterized by its small size, lightweight, and high efficiency, is widely applied to various electronic devices, including terminal equipment and communication equipment, which are primarily driven by electronic computers. It is an indispensable power supply method in the rapidly developing electronic information industry. Battery-powered products are highly sensitive to self-consumption in a host device, especially when a switch circuit is used in cases where a system is not powered on but continuous power supply is required. Currently, designing a reset switch power supply using conventional methods results in complex circuits, heavy workload, high costs, and low efficiency. Moreover, due to the many variables involved in the design of the reset switch power supply, it is difficult to accurately determine the system status, making it challenging to achieve optimal coordination between a main controller and various detection systems, and accurately shut down the reset switch power supply.

Therefore, it is necessary to provide a low-cost, low-power reset switch power supply on-off control circuit and system to solve the problem of reset switch locking, improve the coordination logic between the main controller and various detection devices, and accurately shut down the reset switch power supply.

The above information disclosed in the background art section is only used to enhance the understanding of the background of the application, so it may contain information that does not constitute the prior art known to those of ordinary skill in the art.

SUMMARY

In view of the deficiencies in the prior art, the application provides a reset switch power supply on-off control circuit and system to solve the problem of reset switch locking at low cost and low power consumption. A main controller is informed based on current, voltage, and other detection circuits to make a judgment on the system status, and a switch circuit is shut down through the main controller.

According to a first aspect of the application, a reset switch power supply on-off control circuit is provided, used for a reset switch. The reset switch power supply on-off control circuit comprising:

a reset switch control circuit, connected with the reset switch and configured to collect a status of the reset switch and output a status signal and a first control signal;

an MOS switch circuit, connected with the reset switch control circuit and configured to receive the first control signal from the reset switch control circuit; and a main control chip, connected with the reset switch control circuit and configured to acquire the status signal from the reset switch control circuit and output a second control signal to the reset switch control circuit.

According to some embodiments, the reset switch power supply on-off control circuit further comprising a power module, configured to supply power to the main control chip, the reset switch control circuit and the MOS switch circuit.

According to some embodiments, the reset switch control circuit comprises a signal input unit, a first signal unit and a second signal unit;

the signal input unit is configured to output a first output signal and the status signal according to a status of the reset switch;

the first signal unit is connected with the signal input unit and configured to receive the first output signal and outputting a second output signal; and the second signal unit is connected with the first signal unit and configured to receive the second output signal and output the first control signal.

According to some embodiments, the reset switch control circuit further comprises a buffer unit, connected with the signal input unit and configured to prevent a key from being touched accidentally.

According to some embodiments, the signal input unit comprises a first resistor, a second resistor, a third resistor, a first capacitor, a second capacitor and a first diode;

an end of the first resistor is electrically connected with the power module, another end of the first resistor is electrically connected with an end of the first capacitor and a cathode of the first diode, and another end of the first capacitor is grounded;

an end of the second resistor is electrically connected with the cathode of the first diode, and another end of the second resistor is grounded;

an anode of the first diode is electrically connected with an end of the third resistor, another end of the third resistor is electrically connected with an end of the second capacitor, and another end of the second capacitor is grounded;

the cathode of the first diode receives the status signal and outputs the first output signal; and another end of the third resistor is electrically connected with an output signal IO_POKEY.

According to some embodiments, the buffer unit comprises a first chip, a third capacitor, a fourth capacitor and a fifth capacitor;

the third capacitor, the fourth capacitor and the fifth capacitor are connected in parallel;

an end of the third capacitor is electrically connected with the power module, and another end of the third capacitor is grounded; and an input end of the first chip receives the first output signal, a power end of the first chip is electrically connected with the power module, a grounding end of the first chip is grounded, and an output end of the first chip is electrically connected with the first signal unit.

According to some embodiments, the first signal unit comprises a fourth resistor, a fifth resistor, a sixth resistor, a seventh resistor, an eighth resistor, a sixth capacitor, a first triode and a first MOS tube;

an end of the sixth resistor receives the first output signal, and another end of the sixth resistor is electrically connected with a base electrode of the first triode;

an end of the sixth capacitor is electrically connected with the base electrode of the first triode, and another end of the sixth capacitor is grounded;

an end of the fourth resistor is electrically connected with the power module, and another end of the fourth resistor is electrically connected with a collector electrode of the first triode;

an end of the fifth resistor is electrically connected with the collector electrode of the first triode, and another end of the fifth resistor is electrically connected with a drain electrode of the first MOS tube;

an emitting electrode of the first triode is grounded;

the seventh resistor is connected in parallel with a gate electrode and a source electrode of the first MOS tub;

an end of the eighth resistor is electrically connected with the gate electrode of the first MOS tube, and another end of the eighth resistor is electrically connected with an output signal IO_POPC;

the source electrode of the first MOS tube is grounded; and the drain electrode of the first MOS tube is electrically connected with the second signal unit and outputs the second output signal.

According to some embodiments, the second signal unit comprises a ninth resistor, a tenth resistor, a seventh capacitor, an eighth capacitor, a second triode and a second MOS tube;

a base electrode of the second triode is electrically connected with the first signal unit, and configured to receive the second output signal;

the seventh capacitor is connected in parallel with the base electrode and an emitting electrode of the second triode;

an end of the ninth resistor is electrically connected with the base electrode of the second triode, and another end of the ninth resistor is electrically connected with a drain electrode of the second MOS tube;

an end of the eighth capacitor is electrically connected with the drain electrode of the second MOS tube, and another end of the eighth capacitor is grounded;

the tenth resistor is connected in parallel with a gate electrode and a source electrode of the second MOS tube;

the emitting electrode of the second triode is grounded, and a collector electrode of the second triode is electrically connected with the gate electrode of the second MOS tube; and the drain electrode of the second MOS tube outputs the first control signal, and the source electrode of the second MOS tube is electrically connected with the power module.

According to some embodiments, when the status of the reset switch is that the reset switch is not pressed, the first output signal outputs a high level, the second output signal outputs a low level, and the first control signal outputs a low level; and when the status of the reset switch is that the reset switch is pressed, the first output signal outputs a low level, the second output signal outputs a high level, and the first control signal outputs a high level.

According to some embodiments, when the status of the reset switch is that the reset switch is pressed and then released, the first output signal outputs a high level, the second output signal outputs a low level, and the first control signal maintains a high level.

According to some embodiments, when a duration of pressing the reset switch exceeds a shutdown time threshold, the main control chip outputs the second control signal to the reset switch control circuit, and the first control signal outputs a low level.

According to some embodiments, the MOS switch circuit comprises a photoelectric coupler, an eleventh resistor, a twelfth resistor, a thirteenth resistor, a fourteenth resistor, a fifteenth resistor, a sixteenth resistor, a seventeenth resistor, a ninth capacitor, a third MOS tube, a fourth MOS tube, a fifth MOS tube and a sixth MOS tube;

an end of the thirteenth resistor receives the first control signal, and another end of the thirteenth resistor is electrically connected with a first terminal of the photoelectric coupler;

a second terminal and a third terminal of the photoelectric coupler are grounded;

an end of the fourteenth resistor is electrically connected with a gate electrode of the third MOS tube, and another end of the fourteenth resistor is electrically connected with a fourth terminal of the photoelectric coupler;

the fifteenth resistor is connected in parallel with the gate electrode and a source electrode of the third MOS tube;

the source electrode of the third MOS tube is electrically connected with the power module;

an end of the twelfth resistor is electrically connected with a drain electrode of the third MOS tube, and another end of the twelfth resistor is electrically connected with a gate electrode of the fourth MOS tube;

an end of the ninth capacitor is electrically connected with the gate electrode of the fourth MOS tube, and another end of the ninth capacitor is grounded;

gate electrodes of the fourth MOS tube, the fifth MOS tube, and the sixth MOS tube are electrically connected together, source electrodes of the fourth MOS tube, the fifth MOS tube, and the sixth MOS tube are electrically connected together, and drain electrodes of the fourth MOS tube, the fifth MOS tube, and the sixth MOS tube are grounded;

the eleventh resistor is connected in parallel with the gate electrode and the source electrode of the fourth MOS tube;

an end of the sixteenth resistor is electrically connected with the source electrode of the fourth MOS tube, and another end of the sixteenth resistor is grounded; and the seventeenth resistor is connected in parallel with the sixteenth resistor.

According to some embodiments, when the first control signal is at a high level, the third MOS tube is on, the fourth MOS tube, the fifth MOS tube and the sixth MOS tube are on, and the reset switch power supply on-off control circuit is closed; and when the first control signal is at a low level, the third MOS tube is off, the fourth MOS tube, the fifth MOS tube and the sixth MOS tube are off, and the reset switch power supply on-off control circuit is open.

According to a second aspect of the application, a reset switch power supply on-off control system is provided, comprising the reset switch power supply on-off control circuit according to any part of the first aspect.

The reset switch power supply on-off control circuit and system provided by the application have one or more of the following advantages.

1. The reset switch power supply on-off control system is composed of basic components such as MOS tubes and triodes, which have low cost and low power consumption. Static power consumption can be adjusted by adjusting circuit impedance, making it possible to solve the problem of reset switch locking at low cost and low power consumption.

2. According to an exemplary embodiment, the reset switch power supply on-off control system is provided with a main controller used for reading the pressing status based on current and voltage detection circuits, and an interface for shutting down the system power supply, and determines the device status through the cooperation of the main controller and various detection systems, so as to shut down the system reset switch.

It should be understood that the above general description and the following detailed description are only exemplary, and do not limit the application.

BRIEF DESCRIPTION OF THE DRAWINGS

The above and other objects, features and advantages of the application will become more apparent by describing in detail exemplary embodiments with reference to the accompanying drawings. The drawings described below are only some embodiments of the application, and do not limit the application.

DETAILED DESCRIPTION OF EMBODIMENTS

Figure 1:
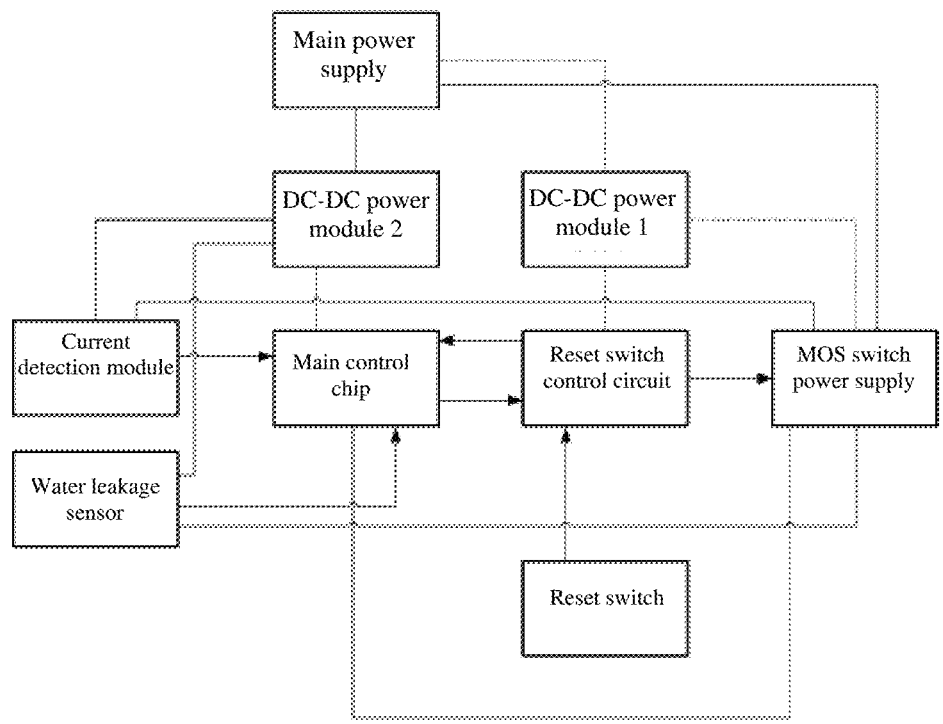
FIG. 1 is a schematic diagram of a reset switch power supply on-off control system according to an exemplary embodiment.

Exemplary embodiments will now be described more fully with reference to the accompanying drawings. However, the exemplary embodiments can be implemented in various forms and should not be construed as limited to the embodiments set forth herein. These embodiments are provided to make this application more thorough and complete, to fully convey the concept of the exemplary embodiments to those skilled in the art. In the drawings, the same reference numerals refer to the same or similar parts, so repeated descriptions will be omitted.

The described features, structures, or characteristics may be combined in any suitable manner in one or more embodiments. In the following description, numerous specific details are provided to give a thorough understanding of the embodiments of the disclosure. However, those skilled in the art will realize that the technical solution of the disclosure can be practiced without one or more of these specific details, or other ways, components, materials or devices can be adopted. In these cases, well-known structures, methods, devices, implementations, materials or operations will not be shown or described in detail.

The flowchart shown in the drawings is only an exemplary illustration, and does not necessarily include all contents and operations/steps, nor does it have to be executed in the described order. For example, some operations/steps can be decomposed, while others can be merged or partially merged, so the actual execution order may change according to the actual situation.

Terms such as "first" and "second" in the specification and claims of this application and the drawings are used to distinguish different objects, but not to describe a specific order. Further, the terms "comprise" and "have" and any variations thereof are intended to cover non-exclusive inclusion. For example, a process, method, system, product or device comprising a series of steps or units is not limited to the listed steps or units, but optionally comprises steps or units not listed, or optionally comprises other steps or units inherent to the process, method, product or device.

Those skilled in the art can understand that the drawings are only diagrams of the exemplary embodiments. The modules or processes in the drawings are not necessarily a must for the implementation of this application, so they cannot be used to limit the scope of protection of this application.

FIG. 1 is a schematic diagram of a reset switch power supply on-off control system according to an exemplary embodiment.

As shown in FIG. 1, the reset switch power supply on-off control system comprises DC-DC power modules 1 and 2, which are both connected with a main power supply and configured to convert the voltage from 12 V to 3.3 V; the DC-DC power module 1 is connected with a reset switch control circuit for providing a converting power supply, and a reset switch is connected with the reset switch control circuit for controlling the reset switch control circuit to perform startup; the DC-DC power module 1 is connected with an MOS switch circuit for providing the converting power supply; the DC-DC power module 2 is connected with a main control chip, a current detection module and a water leakage sensor for providing a power supply; the main control chip is connected with the current detection module and the water leakage sensor, and is configured to collect a system status and enabling timely shutdown in case of system abnormality under the judgment of the main control chip; and the main control chip is connected with the reset switch control circuit, the reset switch control circuit feeds back a pressing status, and the main control chip controls the reset switch control circuit to perform shutdown based on the pressing status and device status.

According to an exemplary embodiment, the reset switch power supply on-off control system comprises a switch circuit power supply return path, which maintains a continuous connection when the power supply is operational. As shown in FIG. 1, the power supply return path is indicated by a dotted line.

According to an exemplary embodiment, the reset switch power supply on-off control system further comprises a system power supply return path, and GND return current on this path will pass through the MOS switch circuit for switch control. The circuit is enabled only when an MOS tube is on. As shown in FIG. 1, this power supply return path is represented by a solid line.

Figure 2:
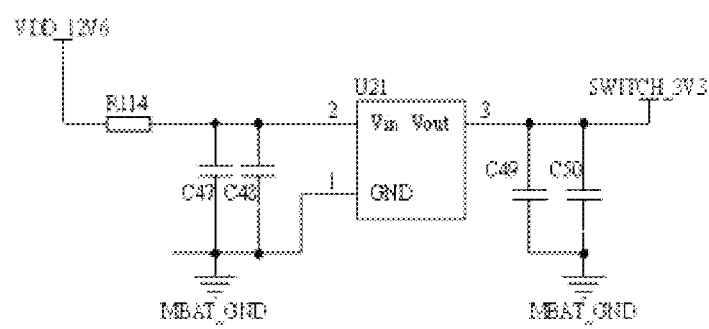
FIG. 2 is a schematic diagram of a power module circuit according to an exemplary embodiment.

FIG. 2 is a schematic diagram of a power module circuit according to an exemplary embodiment.

As shown in FIG. 2, the main power supply is converted from 12.6 V power supply to 3.3 V working power supply through chip processing.

According to an exemplary embodiment, the power input terminal of a chip U21 is connected with a resistor R114, a capacitor C47 and a capacitor C48; the other end of the resistor R114 is connected with a 12.6 V main power supply; the other ends of the capacitor C47 and the capacitor C48 are grounded; the voltage output terminal of the chip U21 is connected with capacitors C49 and C50, and outputs a 3.3 V working power supply; and the other ends of the capacitors C49 and C50 are grounded.

Figure 3:
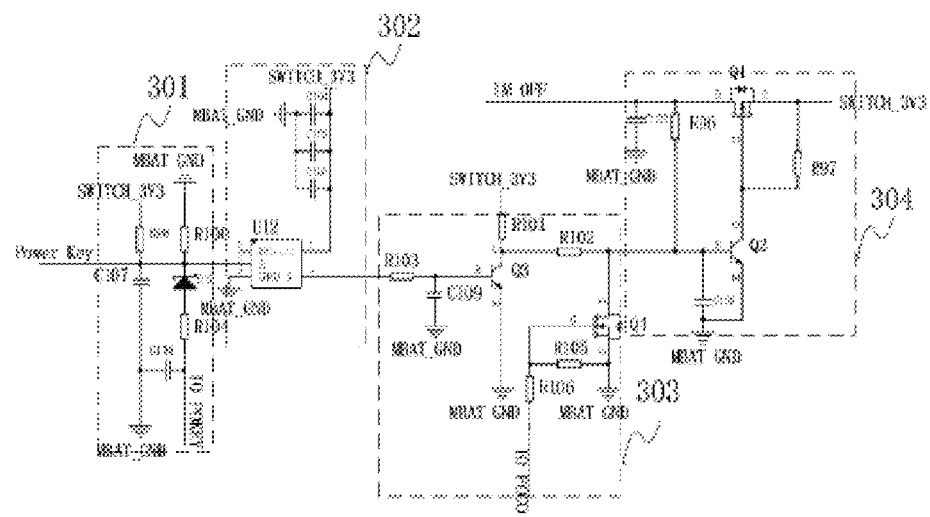
FIG. 3 is a schematic diagram of a reset switch control circuit according to an exemplary embodiment.

FIG. 3 is a schematic diagram of a reset switch control circuit according to an exemplary embodiment.

As shown in FIG. 3, the reset switch control circuit comprises a signal input unit 301, a buffer unit 302, a first signal unit 303 and a second signal unit 304.

According to an exemplary embodiment, the signal input unit 301 comprises resistors R98, R100, R104, capacitors C107, C134, and a diode D12, wherein an end of the resistor R98 is electrically connected with a working power supply, the other end is electrically connected with an end of the capacitor C107, and the other end of the capacitor C107 is grounded; an end of the resistor R100 is grounded, the other end is electrically connected with a cathode of the diode D12, an anode of the diode D12 is electrically connected with an end of the resistor R104, and the other end of the resistor R104 is electrically connected with an output signal IO_POKEY; an end of the capacitor C134 is grounded, and the other end is electrically connected with an output signal IO_POKEY; and a second signal Power_Key is electrically connected with the resistor R98 and the cathode of the diode D12.

According to an exemplary embodiment, the buffer unit 302 comprises a chip U12 and capacitors C104, C105 and C106, wherein the capacitors C104, C105 and C106 are connected in parallel, an end of the capacitor 004 is grounded, and the other end is electrically connected with the working power supply and a power supply VCC terminal of the chip U12; and the second signal Power_Key is electrically connected with an input terminal of the chip U12, and an output terminal of the chip U12 is electrically connected with the first signal unit 303.

According to some embodiments, the buffer unit 302 can prevent unintended activation.

According to an exemplary embodiment, the first signal unit 303 comprises resistors R101, R102, R103, R105 and R106, a capacitor C109, a triode Q3 and a MOS tube Q4; wherein an end of the resistor R103 is electrically connected with the buffer unit 302, and the other end is electrically connected with the base electrode of the triode Q3; an end of the resistor R101 is electrically connected with the working power supply, and the other end is electrically connected with the collector electrode of the triode Q3; an end of the resistor R102 is electrically connected with the collector electrode of the triode Q3, and the other end is electrically connected with the drain electrode of the MOS tube Q4; an end of the capacitor C109 is electrically connected with the base electrode of the triode Q3, and the other end is grounded; the emitting electrode of the triode Q3 is grounded; an end of the resistor R106 is electrically connected with an output signal IO_POPC, and the other end is electrically connected with the gate electrode of the MOS tube Q4; the resistor R105 is connected in parallel with the gate electrode and the source electrode of the MOS tube Q4; the source electrode of the MOS tube Q4 is grounded; and the drain electrode of the MOS tube Q4 is electrically connected with the second signal unit 304.

According to an exemplary embodiment, the second signal unit 304 comprises resistors R96 and R97, capacitors C108 and C128, a triode Q2, and a MOS tube Q1, wherein the base electrode of the triode Q2 is electrically connected with the first signal unit 303, and the capacitor C108 is connected in parallel with the base electrode and the emitting electrode of the triode Q2; the emitting electrode of the triode Q2 is grounded; the collector electrode of the triode Q2 is electrically connected with the gate electrode of the MOS tube Q4; the resistor R97 is connected in parallel with the gate electrode and the source electrode of the MOS tube Q4; one end of the resistor R96 is electrically connected with the base electrode of the triode Q2, and the other end is connected with the drain electrode of the MOS tube Q1; one end of the capacitor C128 is electrically connected with the drain electrode of the MOS tube Q1, and the other end is grounded; an output signal LMOFF is electrically connected with the drain electrode of the MOS tube Q1; and the source electrode of the MOS tube Q1 is electrically connected with the working power supply.

According to an exemplary embodiment, the second signal IO_POKEY sends a switching signal of the reset switch to the main control chip for determining the pressing status.

According to an exemplary embodiment, when the device is in a power-off state, that is, the reset switch is not pressed, there is an open circuit between the second signal Power_Key and GND, and the second signal Power_Key inputs a high level, so the main control chip needs to perform internal pull-up. In this case, the working power supply SWITCH_3V3 will pull up the second signal Power_Key. As a result, the base electrode of the triode Q3 is at a high level, and the triode Q3 is on; the left side of the resistor R102 is at a low level, and the triode Q2 is off; and the gate electrode of the MOS tube Q1 is at a high level, and the MOS tube Q1 is off. At this point, the output signal LM_OFF is at a low level, the diode D12 isolates the high level, and the output signal IO_POKEY has no output.

According to an exemplary embodiment, when the reset switch is pressed, the device is turned on, the second signal Power_Key is connected with GND, and GND pulls down the second signal Power_Key; the base electrode of the triode Q3 is at a low level, the output signal IO_POKEY is at a low level, and the main control chip receives the output signal IO_POKEY and determines that the reset switch is pressed; the base electrode of the triode Q3 is at a low level, and the triode Q3 is off; the left side of the resistor R102 is at a high level, and the triode Q2 is on; and the gate electrode of the MOS tube Q1 is at a low level, and the MOS tube Q1 is on. At this point, the output signal LM_OFF is at a high level.

According to an exemplary embodiment, when the reset switch is released, the device is turned on in the released state; and the second signal Power_Key is disconnected from GND, and the working power supply SWITCH_3V3 pulls up the second signal Power_Key. In this case, the base electrode of the triode Q3 is at a high level, and the output signal IO_POKEY is at a high level; the main control chip receives the output signal IO_POKEY and determines that the reset switch is released; the triode Q3 is on, and the output signal LM_OFF is at a high level; the output signal LM_OFF pulls up the base electrode of the triode Q2, maintaining the base electrode of the triode Q2 at a high level; when the base electrode of the triode Q2 is at a high level, the triode Q2 is on, and the gate electrode of the MOS tube Q1 is at a low level; and the output signal LM_OFF maintains a high level.

According to an exemplary embodiment, when the reset switch is pressed again, the device is turned on in the pressed state; the second signal Power_Key is connected with GND, and GND pulls down the second signal Power_Key; the base electrode of the triode Q3 is at a low level, and the output signal IO_POKEY is at a low level. In this case, the main controller can determine that the key has been pressed, the base electrode of the triode Q2 is already maintained at a high level by the output signal LM_OFF, and the level of the triode Q2 will not change regardless of whether the reset switch is pressed or released.

According to an exemplary embodiment, when the key of the reset switch is pressed again and held for more than the preset shutdown time, the device will power off.

According to an exemplary embodiment, when the key of the reset switch is pressed again, the output signal IO_POKEY is responsible for reading the key status. When the key of the reset switch is held down for more than the preset shutdown time, the main controller will pull up the voltage of IOPOPC, resulting in a high level at the gate electrode of the MOS tube Q4, turning the MOS tube Q4 on, and pull down the base electrode of the triode Q2, turning off the triode Q2. The gate electrode of the MOS tube Q1 will be at a high level, and the MOS tube Q1 is off. The output signal LM_OFF will be at a low level.

According to an exemplary embodiment, the reset switch power supply on-off control system is composed of basic components such as MOS tubes and triodes, which have low cost and low power consumption. Static power consumption can be adjusted by adjusting circuit impedance, making it possible to solve the problem of reset switch locking at low cost and low power consumption.

According to an exemplary embodiment, the reset switch power supply on-off control system is provided with a main controller used for reading the pressing status based on current and voltage detection circuits, and an interface for shutting down the system power supply, and determines the device status through the cooperation of the main controller and various detection systems, so as to shut down the system reset switch.

Figure 4:
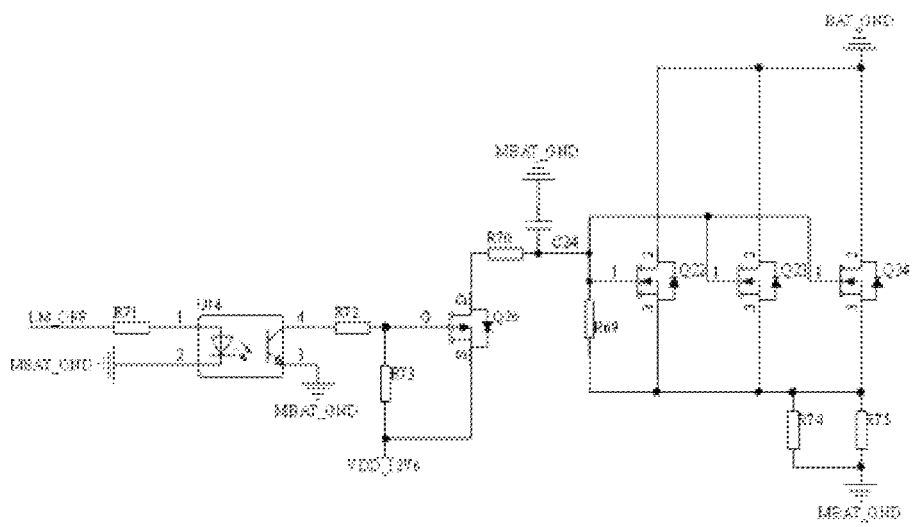
FIG. 4 is a schematic diagram of an MOS switch circuit according to an exemplary embodiment.

FIG. 4 is a schematic diagram of an MOS switch circuit according to an exemplary embodiment.

As shown in FIG. 4, the MOS switch circuit comprises a photoelectric coupler U14, resistors R69, R70, R71, R72, R73, R74 and R75, a capacitor C24, and MOS tubes Q22, Q23, Q24 and Q26.

According to an exemplary embodiment, one end of the resistor R71 is electrically connected with the first signal LM_OFF, the other end is electrically connected with the terminal 1 of the photoelectric coupler U14, and the terminals 2 and 3 of the photoelectric coupler U14 are grounded; one end of the resistor R72 is electrically connected with the terminal 4 of the photoelectric coupler U14, and the other end is electrically connected with the gate electrode of the MOS tube Q26; one end of the resistor R73 is electrically connected with the gate electrode of the MOS tube Q26, and the other end is connected with the main power supply; the source electrode of the MOS tube Q26 is electrically connected with the main power supply, the drain electrode is electrically connected with one end of the resistor R70, and the other end of the resistor R70 is electrically connected with the gate electrode of the MOS tube Q22; one end of the capacitor C24 is electrically connected with the gate electrode of the MOS tube Q22, and the other end is grounded; one end of the resistor R69 is electrically connected with the gate electrode of the MOS tube Q22, and the other end is electrically connected with the source electrode of the MOS tube Q22; the gate electrodes of the MOS tubes Q22, Q23 and Q24 are electrically connected, the source electrodes are electrically connected, and the drain electrodes are grounded; one end of the resistor R75 is electrically connected with the source electrode of the MOS tube Q24, and the other end is grounded; and the resistor R74 is connected in parallel with the resistor R75.

According to an exemplary embodiment, when the first signal LM_OFF is at a high level, the terminals 3 and 4 of the photoelectric coupler U14 are on, the gate electrode of the MOS tube Q26 is pulled down, the MOS tube Q26 is on, and the MOS tubes Q22, Q23 and Q24 are on, completing the system circuit.

According to an exemplary embodiment, when the first signal LM_OFF is at a low level, the terminals 3 and 4 of the photoelectric coupler U14 are off, the gate electrode of the MOS tube Q26 is pulled up, the MOS tube Q26 is off, and the MOS tubes Q22, Q23 and Q24 are off, breaking the system circuit.

It should be clearly understood that this application describes how to form and use specific examples, but this application is not limited to any details of these examples. On the contrary, based on the teachings of the disclosure, these principles can be applied to many other embodiments.

In addition, it should be noted that the above drawings are only illustrations of the processes included in the method according to the exemplary embodiments of the application, and are not for limiting purposes. It is easy to understand that the processes shown in the above figures do not indicate or limit the time sequence of these processes. In addition, it is also easy to understand that these processes can be performed synchronously or asynchronously in multiple modules, for example.

Exemplary embodiments of the application have been particularly shown and described above. It should be understood that this application is not limited to the detailed structure, arrangement or implementation described here; on the contrary, this application is intended to cover various modifications and equivalent arrangements included within the spirit and scope of the appended claims.

What is claimed is:

1. A reset switch power supply on-off control circuit, used for a reset switch, the control circuit comprising:
    a reset switch control circuit, connected with the reset switch, and configured to collect a status of the reset switch and output a status signal and a first control signal;
    a MOS switch circuit, connected with the reset switch control circuit, and configured to receive the first control signal from the reset switch control circuit; and
    a main control chip, connected with the reset switch control circuit, and configured to acquire the status signal from the reset switch control circuit and output a second control signal to the reset switch control circuit.

2. The control circuit according to claim 1, further comprising a power module configured to supply power to the main control chip, the reset switch control circuit, and the MOS switch circuit.

3. The control circuit according to claim 2, wherein the reset switch control circuit comprises a signal input unit, a first signal unit, and a second signal unit, wherein:
    the signal input unit is configured to output a first output signal and the status signal according to the status of the reset switch;
    the first signal unit is connected with the signal input unit and is configured to receive the first output signal and output a second output signal; and
    the second signal unit is connected with the first signal unit and is configured to receive the second output signal and output the first control signal.

4. The control circuit according to claim 3, wherein the reset switch control circuit further comprises a buffer unit connected with the signal input unit and is configured to prevent a key from being touched accidentally.

5. The control circuit according to claim 4, wherein the buffer unit comprises a first chip, a third capacitor, a fourth capacitor, and a fifth capacitor, wherein:
the third capacitor, the fourth capacitor, and the fifth capacitor are connected in parallel;
an end of the third capacitor is electrically connected with the power module, and another end of the third capacitor is grounded; and
an input end of the first chip receives the first output signal, a power end of the first chip is electrically connected with the power module, a grounding end of the first chip is grounded, and an output end of the first chip is electrically connected with the first signal unit.

6. The control circuit according to claim 3, wherein the signal input unit comprises a first resistor, a second resistor, a third resistor, a first capacitor, a second capacitor, and a first diode, wherein:
an end of the first resistor is electrically connected with the power module, another end of the first resistor is electrically connected with an end of the first capacitor and a cathode of the first diode, and another end of the first capacitor is grounded;
an end of the second resistor is electrically connected with the cathode of the first diode, and another end of the second resistor is grounded;
an anode of the first diode is electrically connected with an end of the third resistor, another end of the third resistor is electrically connected with an end of the second capacitor, and another end of the second capacitor is grounded;
the cathode of the first diode receives the status signal and outputs the first output signal; and
another end of the third resistor is electrically connected with an output signal IO_POKEY.

7. The control circuit according to claim 6, wherein the MOS switch circuit comprises a photoelectric coupler, an eleventh resistor, a twelfth resistor, a thirteenth resistor, a fourteenth resistor, a fifteenth resistor, a sixteenth resistor, a seventeenth resistor, a ninth capacitor, a third MOS tube, a fourth MOS tube, a fifth MOS tube, and a sixth MOS tube, wherein:
an end of the thirteenth resistor receives the first control signal, and another end of the thirteenth resistor is electrically connected with a first terminal of the photoelectric coupler;
a second terminal and a third terminal of the photoelectric coupler are grounded;
an end of the fourteenth resistor is electrically connected with a gate electrode of the third MOS tube, and another end of the fourteenth resistor is electrically connected with a fourth terminal of the photoelectric coupler;
the fifteenth resistor is connected in parallel with the gate electrode and a source electrode of the third MOS tube;
the source electrode of the third MOS tube is electrically connected with the power module;
an end of the twelfth resistor is electrically connected with a drain electrode of the third MOS tube, and another end of the twelfth resistor is electrically connected with a gate electrode of the fourth MOS tube;
an end of the ninth capacitor is electrically connected with the gate electrode of the fourth MOS tube, and another end of the ninth capacitor is grounded;
gate electrodes of the fourth MOS tube, the fifth MOS tube, and the sixth MOS tube are electrically connected together, source electrodes of the fourth MOS tube, the fifth MOS tube, and the sixth MOS tube are electrically connected together, and drain electrodes of the fourth MOS tube, the fifth MOS tube, and the sixth MOS tube are grounded;
the eleventh resistor is connected in parallel with the gate electrode and the source electrode of the fourth MOS tube;
an end of the sixteenth resistor is electrically connected with the source electrode of the fourth MOS tube, and another end of the sixteenth resistor is grounded; and
the seventeenth resistor is connected in parallel with the sixteenth resistor.

8. The control circuit according to claim 7, wherein:
when the first control signal is at a high level, the third MOS tube, the fourth MOS tube, the fifth MOS tube and the sixth MOS tube are on, and the reset switch power supply on-off control circuit is closed; and
when the first control signal is at a low level, the third MOS tube, the fourth MOS tube, the fifth MOS tube and the sixth MOS tube are off, and the reset switch power supply on-off control circuit is open.

9. The control circuit according to claim 3, wherein the first signal unit comprises a fourth resistor, a fifth resistor, a sixth resistor, a seventh resistor, an eighth resistor, a sixth capacitor, a first triode and a first MOS tube, wherein:
an end of the sixth resistor receives the first output signal, and another end of the sixth resistor is electrically connected with a base electrode of the first triode;
an end of the sixth capacitor is electrically connected with the base electrode of the first triode, and another end of the sixth capacitor is grounded;
an end of the fourth resistor is electrically connected with the power module, and another end of the fourth resistor is electrically connected with a collector electrode of the first triode;
an end of the fifth resistor is electrically connected with the collector electrode of the first triode, and another end of the fifth resistor is electrically connected with a drain electrode of the first MOS tube;
an emitting electrode of the first triode is grounded;
the seventh resistor is connected in parallel with a gate electrode and a source electrode of the first MOS tube;
an end of the eighth resistor is electrically connected with the gate electrode of the first MOS tube, and another end of the eighth resistor is electrically connected with an output signal IO_POPC;
the source electrode of the first MOS tube is grounded; and
the drain electrode of the first MOS tube is electrically connected with the second signal unit and outputs the second output signal.

10. The control circuit according to claim 3, wherein the second signal unit comprises a ninth resistor, a tenth resistor, a seventh capacitor, an eighth capacitor, a second triode, and a second MOS tube, wherein:
a base electrode of the second triode is electrically connected with the first signal unit, and is configured to receive the second output signal;
the seventh capacitor is connected in parallel with the base electrode and an emitting electrode of the second triode;
an end of the ninth resistor is electrically connected with the base electrode of the second triode, and another end of the ninth resistor is electrically connected with a drain electrode of the second MOS tube;
an end of the eighth capacitor is electrically connected with the drain electrode of the second MOS tube, and another end of the eighth capacitor is grounded;

the tenth resistor is connected in parallel with a gate electrode and a source electrode of the second MOS tube;

the emitting electrode of the second triode is grounded, and a collector electrode of the second triode is electrically connected with the gate electrode of the second MOS tube; and the drain electrode of the second MOS tube outputs the first control signal, and the source electrode of the second MOS tube is electrically connected with the power module.

11. The control circuit according to claim 3, wherein when the status of the reset switch is that the reset switch is not pressed, the first output signal outputs a high level, the second output signal outputs a low level, and the first control signal outputs a low level; and when the status of the reset switch is that the reset switch is pressed, the first output signal outputs a low level, the second output signal outputs a high level, and the first control signal outputs a high level.

12. The control circuit according to claim 11, wherein when the status of the reset switch is that the reset switch is pressed and then released, the first output signal outputs a high level, the second output signal outputs a low level, and the first control signal maintains a high level.

13. The control circuit according to claim 11, wherein when a duration of pressing the reset switch exceeds a shutdown time threshold, the main control chip outputs the second control signal to the reset switch control circuit, and the first control signal outputs a low level.

14. A reset switch power supply on-off control system, comprising the reset switch power supply on-off control circuit according to claim 1.

* * * * *